US012573595B2

(12) United States Patent
Wang et al.

(10) Patent No.: US 12,573,595 B2
(45) Date of Patent: Mar. 10, 2026

(54) PLASMA PROCESSING APPARATUS AND METHOD OF ADJUSTING THE SAME

(71) Applicant: ADVANCED MICRO-FABRICATION EQUIPMENT INC. CHINA, Shanghai (CN)

(72) Inventors: Mingming Wang, Shanghai (CN); Yunwen Huang, Shanghai (CN); Dee Wu, Shanghai (CN); Jinquan Yang, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 1119 days.

(21) Appl. No.: 17/521,777

(22) Filed: Nov. 8, 2021

(65) Prior Publication Data

US 2022/0157570 A1 May 19, 2022

(30) Foreign Application Priority Data

Nov. 18, 2020 (CN) .......................... 202011295090.3

(51) Int. Cl.
*H01J 37/32* (2006.01)
*H01L 21/68* (2006.01)

(52) U.S. Cl.
CPC .... *H01J 37/32568* (2013.01); *H01J 37/3244* (2013.01); *H01J 37/32715* (2013.01);
(Continued)

(58) Field of Classification Search
None
See application file for complete search history.

(56) References Cited

U.S. PATENT DOCUMENTS

2001/0018272 A1* 8/2001 Haji .................. H01L 21/67069
438/710
2004/0149214 A1* 8/2004 Hirose ............. H01L 21/67126
118/715
(Continued)

FOREIGN PATENT DOCUMENTS

CN 1812685 A 8/2006
CN 111627843 A 9/2020
(Continued)

OTHER PUBLICATIONS

English Machine translation of Wi (KR-101484273-B1) retrieved from ESPACENET Dec. 30, 2024 (Year: 2024).*
(Continued)

*Primary Examiner* — Ram N Kackar
*Assistant Examiner* — Laureen Chan
(74) *Attorney, Agent, or Firm* — Womble Bond Dickinson (US) LLP

(57) ABSTRACT

Disclosed are a plasma processing apparatus and an adjusting method of the same. The apparatus includes: a vacuum chamber enclosed by a chamber body and a chamber lid; a movable upper electrode assembly disposed in the vacuum chamber; a bottom electrode assembly, arranged opposite the movable upper electrode assembly, the bottom electrode assembling being detachably connected with the bottom of the chamber body; a plurality of self-alignment devices each including a self-alignment upper structure and a self-alignment lower structure, the self-alignment upper structure and the self-alignment lower structure being connected to the movable upper electrode assembly and the bottom electrode assembly, respectively, wherein when the self-alignment upper structures and the self-alignment bottom structures are aligned to be jointed together, the center of the movable upper electrode assembly is aligned with that of the bottom electrode assembly. The disclosure offers the following
(Continued)

advantages: through cooperation between the self-alignment upper structures and the self-alignment lower structures, the plasma processing apparatus realizes concentricity adjustment between the movable upper electrode assembly and the lower electrode assembly, rendering the self-alignment devices simple in structure and convenient to operate and alleviating testing pressures on operators.

16 Claims, 4 Drawing Sheets

(52) U.S. Cl.
CPC .... *H01L 21/68* (2013.01); *H01J 2237/20235* (2013.01); *H01J 2237/334* (2013.01)

(56) References Cited

U.S. PATENT DOCUMENTS

| | | | | | |
|---|---|---|---|---|---|
| 2004/0182515 | A1* | 9/2004 | Sato | | C03C 15/00 |
| | | | | | 156/345.43 |
| 2005/0099135 | A1* | 5/2005 | Landis | | H01J 37/32642 |
| | | | | | 315/111.41 |
| 2008/0099120 | A1* | 5/2008 | Larson | | H01J 37/32009 |
| | | | | | 156/1 |
| 2008/0190556 | A1 | 8/2008 | Sexton et al. | | |
| 2013/0323860 | A1* | 12/2013 | Antolik | | H01J 37/023 |
| | | | | | 156/345.34 |
| 2019/0318942 | A1* | 10/2019 | Choi | | H01J 37/32128 |

FOREIGN PATENT DOCUMENTS

| | | | | | |
|---|---|---|---|---|---|
| JP | 2001210622 | A | * | 8/2001 | |
| KR | 20090080520 | A | | 7/2009 | |
| KR | 20090106636 | A | | 10/2009 | |
| KR | 20100005640 | A | | 1/2010 | |
| KR | 101484273 | B1 | * | 1/2015 | ........ H01J 37/32623 |

OTHER PUBLICATIONS

English Machine translation of Iwai (JP-2001210622-A) retrieved from ESPACENET Jan. 13, 2025 (Year: 2025).*

* cited by examiner

PLASMA PROCESSING APPARATUS AND METHOD OF ADJUSTING THE SAME

RELATED APPLICATIONS

The present application claims priority to and the benefit of Chinese Patent Application No. 202011295090.3, filed on Nov. 18, 2020, and the disclosure of which is hereby incorporated by reference in its entirety.

FIELD

Embodiments of the present disclosure relate to semiconductor equipment, and more particularly relate to a plasma processing apparatus and a method of adjusting the same.

BACKGROUND

Processes such as plasma etching, physical vapor deposition, and chemical vapor deposition are conventionally applied in microfabrication of semiconductor devices or substrates, for example, in manufacturing flexible displays, panel displays, LEDs, and solar cells. Various steps of microfabrication may include a plasma-assisted process, e.g., a bevel etch process which is generally carried out in a vacuum process chamber. To apply bevel etch, caution should be taken to keep the semiconductor device forming region on the frontside of the wafer from being damaged by plasma, whereas only the extreme edge area, lateral and underside edge areas of the wafer need cleaning to remove a thin film generated in those areas during the course of wafer processing; otherwise, the subsequent processing would be adversely affected.

To ensure etching uniformity and performance, the wafer should be laid flat. In addition, the concentricity between an upper electrode assembly and a bottom electrode assembly should also be ensured, such that the etched areas thereof overlap each other, thereby ensuring etching performance. Only when the bottom electrode assembly and the upper electrode assembly are concentrically and parallel arranged, can the spacing between the wafer on the bottom electrode assembly and the upper electrode assembly be made as small as possible such that no plasma is generated under excitation of a RF electrical field; while since the wafer edge area has a relatively large space, plasma can be generated there, such that only the wafer edge area is etched.

When the wafer is transferred in/out of the vacuum chamber, the upper electrode assembly is lifted; during the course of processing the wafer, the upper electrode assembly is lowered and leaves a very small gap with respect to the wafer. Therefore, when the upper electrode assembly is lowered approximating the wafer, it shall maintain a very high concentricity with respect to the wafer and the bottom electrode assembly, such that those portions of the wafer edge area exposed to the plasma are symmetrical in the circumferential direction, thereby achieving uniform etching and guaranteeing performance of bevel etch.

In the plasma processing apparatus, the upper electrode assembly is conventionally connected with the chamber lid of the vacuum chamber. In routine maintenance, the chamber lid is frequently opened so as to adjust the in-chamber structures. As such, after each flipping, opening, and closing of the chamber lid, it has to be center realigned with respect to the upper electrode assembly, for maintaining a relatively high concentricity between the upper electrode assembly and the wafer, which, however, is time consuming, potentially affecting operating life of the plasma processing apparatus. Additionally, after repetitively flipping, opening, and closing of the chamber lid, the upper electrode assembly connected with the chamber might have a position drift, such that even the chamber lid completes center realignment, the area subjected to bevel etch is still likely biased, affecting etching performance.

SUMMARY

An objective of the present disclosure is to provide a plasma processing apparatus and a method of adjusting the same, wherein cooperation between self-alignment upper structures and self-alignment lower structures of self-alignment devices enables the plasma processing apparatus to realize concentricity adjustment between the movable upper electrode assembly and the bottom electrode assembly, and since the self-alignment devices are simple in structure and convenient to operate, testing labor of operators can be alleviated.

The present disclosure is implemented through the technical solutions below:

A plasma processing apparatus, comprising:

a vacuum chamber enclosed by a chamber body and a chamber lid;

a movable upper electrode assembly disposed in the vacuum chamber;

a bottom electrode assembly, arranged opposite the movable upper electrode assembly, the bottom electrode assembling being detachably connected with the bottom of the chamber body;

a plurality of self-alignment devices each including a self-alignment upper structure and a self-alignment lower structure, the self-alignment upper structure and the self-alignment lower structure being connected to the movable upper electrode assembly and the bottom electrode assembly, respectively, wherein when the self-alignment upper structures and the self-alignment bottom structures are aligned to be jointed together, the center of the movable upper electrode assembly is aligned with that of the bottom electrode assembly.

Optionally, the self-alignment upper structure is an aligning hole of a recessed structure, the aligning hole being connected to the movable upper electrode assembly.

The self-alignment bottom structure is a guide mechanism connected to the bottom electrode assembly, the guide mechanism including a guide pin, wherein the guide pin, when entering the aligning hole, pushes the bottom electrode assembly and the movable upper electrode assembly to be center aligned.

Optionally, the self-alignment lower structure is an aligning hole of a recessed structure, the aligning hole being connected to the bottom electrode assembly.

The self-alignment upper structure is a guide mechanism, which is connected to the movable upper electrode assembly; the guide mechanism includes a guide pin, wherein the guide pin, when entering the aligning hole, pushes the bottom electrode assembly and the movable upper electrode assembly to be center aligned.

Optionally, the guide mechanism comprises an accommodation space provided with a through hole, the through hole being arranged opposite the aligning hole, the guide pin being at least partially received in the accommodation space.

Optionally, the top of the guide pin has a bevel structure.

Optionally, the self-alignment device further comprises:

an elastomer disposed in the accommodation space, wherein the elastomer is connected to the bottom of the guide pin.

Optionally, the plasma processing apparatus further comprises:

a plurality of lifting devices each being connected to the movable upper electrode assembly so as to lift and lower the movable upper electrode assembly; wherein each of the lift devices includes a support structure and a drive device, the support structure having one end connected to the movable upper electrode assembly and the other end connected to the drive device, the drive device being configured to drive the support structure to lift and lower the movable upper electrode assembly.

Optionally, the plasma processing apparatus further comprises:

a plurality of gas channels each extending from outside the vacuum chamber, through the bottom of the vacuum chamber, the inside of the support structure, and the movable upper electrode assembly in sequence, respectively, wherein the gas channels are configured to inject process gases into the vacuum chamber.

Optionally, the plasma processing apparatus further comprises:

a plurality of gas channels each extending from outside the vacuum chamber, through the top of the vacuum chamber and the movable upper electrode assembly in sequence, respectively, wherein the gas channels are configured to inject process gases into the vacuum chamber.

Optionally, each support structure comprises:

a guide rod connected to the movable upper electrode assembly, wherein the gas channel passes through the inside of the guide rod to transfer the process gases;

a threaded rod, one end of which is connected to the drive device, the other end of which is connected to the guide rod.

Optionally, the threaded rod is connected to the guide rod via a horizontal adjustment assembly, the horizontal adjustment assembly including:

a cross-shaped structure, the upper end of which is in threaded connection with the bottom of the guide rod, the lower end of which is in threaded connection with the top of the threaded rod; and a clamping mechanism, including an upper clamping device and a lower clamping device, the upper clamping device being in threaded connection with the bottom of the guide rod, the lower clamping device being in threaded connection with the top of the threaded rod, wherein the upper clamping device and the lower clamping device vertically clamp together to secure left and right ends of the cross-shaped structure.

Optionally, the plasma processing apparatus further comprises:

a first gearing device, which encloses and is in threaded connection with each of the support structures;

a plurality of recessed structures provided at portions where the bottom of the chamber body is in contact with the support structures, wherein a plurality of extended elements is provided along the circumferential direction of the support structures, the extended elements being vertically displaceable in the recesses, but nonrotatable in the circumferential direction;

a second gearing device via which the drive device is in threaded connection with one support structure of a plurality of support structures, such that when the drive device rotates, the support structure is driven to be vertically displaced due to reacting force of the support structure, while the remaining support structures are driven to be displaced synchronously via the first gearing device.

Optionally, the first gearing device is a belt structure; and/or the second gearing device is a belt structure.

Optionally, the plasma processing apparatus further comprises:

a plurality of guide bearings, respectively disposed at portions where the bottom of the chamber body is in contact with the respective support structures, so as to ensure lifting perpendicularity of the support structures.

Optionally, the plasma processing apparatus further comprises:

a plurality of sealing devices, respectively sleeved over portions where the support structures is outside the vacuum chamber, wherein each of the sealing devices has one end connected to the bottom of the chamber body, and the other end connected to the support structure.

Optionally, the gas channels are edge gas inlet channels or center gas inlet channels, wherein the edge gas inlet channels are configured to inject the process gases above the wafer edge area in the vacuum chamber via a plurality of edge gas nozzles, and the center gas inlet channels are configured to inject the process gases above the wafer center area of the vacuum chamber via a plurality of center gas nozzles.

Optionally, the bottom electrode assembly is connected with the bottom of the chamber body via a screw assembly; and/or, a plurality of sealing structures are further provided between the bottom of the bottom electrode assembly and the chamber body so as to ensure air-tightness of the vacuum chamber;

and/or, the self-alignment device is made of a metal material;

and/or, the self-alignment upper structure is connected with the movable upper electrode assembly or the bottom electrode assembly via a screw assembly;

and/or, the self-alignment lower structure is connected with the bottom electrode assembly or the movable upper electrode assembly via a screw assembly.

Optionally, there is provided a method of adjusting a plasma processing apparatus, comprising:

providing the plasma processing apparatus described above;

adjusting the bottom electrode assembly to be loosely connected with the chamber body;

adjusting the movable upper electrode assembly to move downward such that the self-alignment upper structures and the self-alignment lower structures are aligned to be joined together, wherein the bottom electrode assembly is stressed to be displaced; and aligning the self-alignment upper structures and the self-alignment lower structures to be joined together so as to adjust the movable upper electrode assembly and the bottom electrode assembly to be concentric;

Optionally, the method of adjusting a plasma processing apparatus further comprises:

detaching the self-alignment upper structures from the self-alignment lower structures.

Optionally, before concentricity adjustment, levelling the movable upper electrode assembly, wherein the levelling process specifically comprises:

adjusting the upper clamping device and the lower clamping device of the clamping mechanism to loosen the cross-shaped structure;

rotating the cross-shaped structure at a lower position or a higher position of the movable upper electrode assembly, till the movable upper electrode assembly maintains horizontal;

adjusting the upper clamping device and the lower clamping device of the clamping mechanism to securely clamp left and right ends of the cross-shaped structure.

Optionally, the method of adjusting a plasma processing apparatus further comprises:

activating the drive device to rotate to drive, via the second gearing device, vertical movement of the support structure in contact with the second gearing device;

driving, via the first gearing device, the remaining support structures to rotate synchronously.

Compared with the prior art, the present disclosure offers the following advantages:

In the plasma processing apparatus and the method of adjusting the same as provided by the present disclosure, cooperation between the self-alignment upper structures and the self-alignment lower structures of self-alignment devices enables the plasma processing apparatus to realize concentricity adjustment between the movable upper electrode assembly and the lower electrode assembly, rendering the self-alignment devices simple in structure and convenient to operate, significantly reducing the time taken for concentricity adjustment between the movable upper electrode assembly and the bottom electrode assembly, reducing tool occupation time, simplifying the adjustment process, thereby increasing tool utilization and meanwhile reducing testing labor of operators.

Furthermore, the self-alignment devices are detachable, which may be removed upon completion of center alignment, thereby saving the space in the vacuum chamber. In this way, more components may be installed in the vacuum chamber to ensure etching performance of the etch process.

Furthermore, in the plasma processing apparatus, the process gases is injected into the vacuum chamber via the inside of the support structures and the movable upper electrode assembly; since there is no connection between the movable upper electrode assembly and the chamber lid, opening of the chamber lid, no matter how frequently, has no impact on the concentricity between the movable upper electrode assembly and the bottom electrode assembly, thereby avoiding frequent concentricity adjustment.

Furthermore, the drive device of the plasma processing apparatus activates the second gearing device to rotate to drive one support structure in contact with the second gearing device to be displaced vertically; and then activates the first gearing device to drive the remaining support structures to synchronously move vertically; the plurality of components cooperate to jointly implement lifting and lowering of the movable upper electrode assembly, offering a simple structure and a convenient operation.

BRIEF DESCRIPTION OF THE SEVERAL VIEWS OF THE DRAWINGS

To elucidate the technical solutions of the present disclosure, the drawings used in describing the embodiments will be briefly introduced below. It is apparent that the drawings as described only relate to some embodiments of the present disclosure. To those skilled in the art, other drawings may be derived based on these drawings without exercise of inventive work, wherein.

DETAILED DESCRIPTION

To make the objects, technical solutions, and advantages of the embodiments of the present disclosure much clearer, the technical solutions in the embodiments of the present disclosure will be described clearly and comprehensively with reference to the accompanying drawings; apparently, the embodiments as described are only part of the embodiments of the present disclosure, rather than all of them. All other embodiments obtained by those skilled in the art without exercise of inventive work based on the examples in the embodiments all fall within the protection scope of the present disclosure.

It needs also be noted that the terms "include," "comprise", "have" or any other variables intend for a non-exclusive inclusion, such that a process, a method, an item or a terminal device comprising a series of elements not only includes such elements, but also includes other elements that are not explicitly specified or those elements inherent in the process, method, article or terminal device. Without more restrictions, an element limited by the phase "including . . . " or "comprising . . . " does not exclude a presence of further equivalent elements in the process, method, article or terminal device including the elements.

It is noted that the drawings are simplified and illustrated in a non-precision scale, only intended for facilitating convenient and clear illustration of embodiments of the present disclosure.

First Embodiment

Figure 1:
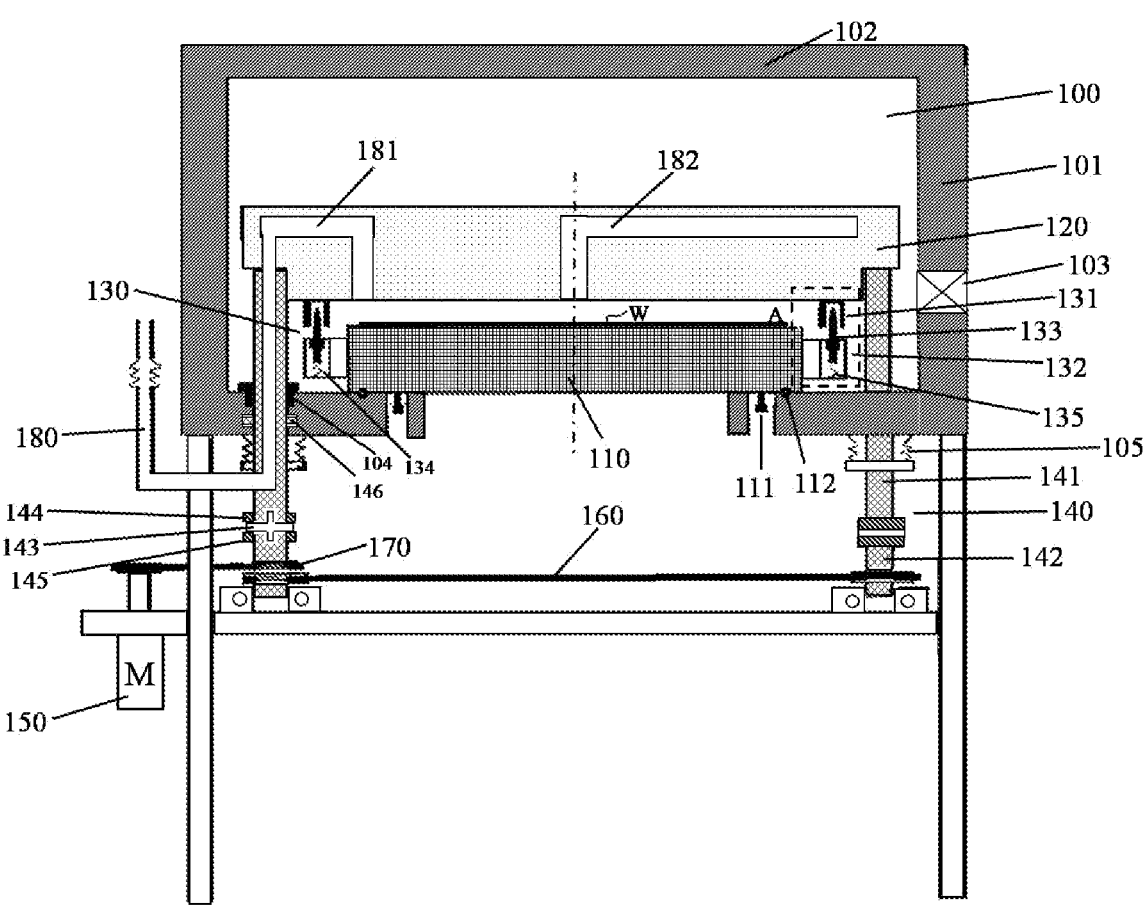
FIG. 1 is a schematic diagram of a plasma processing apparatus according to the present disclosure.

Refer to FIG. 1, which illustrates a plasma processing apparatus according to the present disclosure. The plasma processing apparatus comprises: a vacuum chamber 100 enclosed by a chamber body 101 and a chamber lid 102 that are both made of a metal material, a wafer transfer port 103 being provided on the chamber body 101, the wafer transfer port 103 being configured to transfer the wafer W in and out of the vacuum chamber 100. The vacuum chamber 100 includes a bottom electrode assembly 110 disposed at the inner bottom of the vacuum chamber 100, the bottom electrode assembly 110 being provided with a supporting surface, wherein the to-be-processed wafer W transferred in the vacuum chamber 100 is placed on the supporting surface. Furthermore, the bottom electrode assembly 110 is detachably connected with the bottom of the chamber body 101 so as to facilitate adjusting the bottom electrode assembly 110. A movable upper electrode assembly 120 arranged opposite the bottom electrode assembly 110 is further provided in the vacuum chamber 100, the movable upper electrode assembly 120 being disposed on the top of the vacuum chamber 100, the movable upper electrode assembly 120 comprises an outer periphery region of conductive material and a center region of dielectric material, wherein at least one RF power source (not shown) is applied to at least one of the bottom electrode assembly 110 and the outer periphery region of the movable upper electrode assembly 120 via a match network so as to deionize the process gases into plasma; in this way, plasma is generated between the outer periphery region of the movable upper electrode assembly 120 and the bottom electrode assembly 110, wherein the plasma is configured to etch the edge area of the wafer W. Specifically, the plasma includes large quantities of active particles such as electrons, ions, excited atoms, molecules, and free radicals. The active particles may undergo a plurality of physical and/or chemical reactions on the surface of the to-be-processed wafer W, transforming the profile of the bevel of the to-be-processed wafer W, thereby completing bevel etch process to the to-be-processed wafer W.

In this embodiment, the plasma processing apparatus is applicable to wafer W bevel etch. During the course of plasma etching the wafer W with a designed pattern, some redundant film layers are likely to pile up on the front and back side outer edge areas of the wafer W, such as polysilicon layer, nitride layer, metal layer, etc., while these redundant film layers are likely to contaminate subsequent processes and devices; therefore, they need to be removed through a bevel etch process. During the bevel etch process, the process gases usually includes an etch gas such as F and Cl, a clean gas such as $O_2$, as well as other etch-assisted gases.

As illustrated in FIG. 1, the plasma processing apparatus further comprises: a plurality of self-alignment devices 130 each including a self-alignment upper structure 131 and a self-alignment lower structure 132, the self-alignment upper structures 131 and the self-alignment lower structures 132 being connected to the movable upper electrode assembly 120 and the bottom electrode assembly 110, respectively, wherein when the self-alignment upper structures 131 and the self-alignment lower structures 132 are aligned to be joined together, the center of the movable upper electrode assembly 120 is aligned with the center of the bottom electrode assembly 110.

In this embodiment, the bottom electrode assembly 110 and the bottom of the chamber body 101 are connected via a screw assembly 111. When it is needed to perform center alignment between the movable upper electrode assembly 120 and the bottom electrode assembly 110, the connection between the bottom electrode assembly 110 and the chamber body 101 is adjusted loose, and the movable upper electrode assembly 120 and the bottom electrode assembly 110 are adjusted such that the self-alignment upper structures 131 and the self-alignment lower structures 132 are aligned and joined together, wherein the bottom electrode assembly 110 is stressed to be displaced. After the self-alignment upper structures 131 and the self-alignment lower structures 132 are aligned to be joined together, the center axis of the movable upper electrode assembly 120 overlaps that of the bottom electrode assembly 110;

The self-alignment upper structure 131 is an aligning hole of a recessed structure, and the self-alignment upper structure 131 is connected to the movable upper electrode assembly 120 via a screw assembly. The self-alignment lower structure 132 is a guide mechanism, which is connected to the bottom electrode assembly 110 via a screw assembly; the guide mechanism includes a guide pin 133, wherein the guide pin 133, when entering the aligning hole, pushes the bottom electrode assembly 110 and the movable upper electrode assembly 120 to be center aligned.

Optionally, the self-alignment upper structure 131 may be positioned at the bottom or side edge periphery of the movable upper electrode assembly 120, and the self-alignment bottom structure 132 may be positioned on the upper surface or side edge periphery of the bottom electrode assembly 110. The present disclosure has no limitations to their specific positions. In this embodiment, the self-alignment upper structure 131 may be connected with the bottom edge of the movable upper electrode assembly 120, and the self-alignment lower structure 132 may be connected with the side edge periphery of the bottom electrode assembly 110. Of course, the self-alignment devices 130 are not limited to the above structures, which can be any device that may implements center alignment function.

Furthermore, the self-alignment lower structure 132 includes an accommodation space 134, the top of the accommodation space 134 being provided with a through hole, the through hole being arranged opposite the aligning holes, the guide pin 133 being at least partially disposed in the accommodation space 134, the guide pin 133 extending out of the accommodation space 134 via the through hole.

The self-alignment device 130 further includes an elastomer 135 disposed in the accommodation space 134, wherein the elastomer 135 is connected to the bottom of the guide pin 133. Please refer to FIG. 2 and FIG. 3 in combination. When the center of the movable upper electrode assembly 120 is offset too much from that of the bottom electrode assembly 110, the guide pin 133 is inserted into the aligning hole of the self-alignment upper structure 131, and the movable upper electrode assembly 120 continuously moves downward; in this case, the guide pin 133 is subjected to the acting forces from the radial direction F1 and the perpendicular direction F2; the self-alignment upper structure 131 is likely to apply a too much stress on the guide pin 133 to thereby damage the bottom electrode assembly 110; with the elastomer 135, a buffer space is provided to the guide pin 133 to protect the bottom electrode assembly 110 from being damaged. In this embodiment, the elastomer 135 refers a spring, which is connected to the bottom of the guide pin 133.

Preferably, the top of the guide pin 133 has a bevel structure. To perform center alignment to the movable upper electrode assembly 120 and the bottom electrode assembly 110, the guide pin 133 is inserted into the recessed structure of the self-alignment upper structure 131, such that the bevel structure on the top of the guide pin facilitates easy access into the recessed structure. When the central axis of the movable upper electrode assembly 120 is relatively distant from that of the bottom electrode assembly 110, the guide pin 133 may also be inserted into the recessed structure, thereby expanding the adjustment range. Optionally, the self-alignment devices 130 are made of a metal material so as to offer enough rigidity and strength to ensure that the bottom electrode assembly 110 is displaced when being pushed under an enough acting force.

Figure 2:
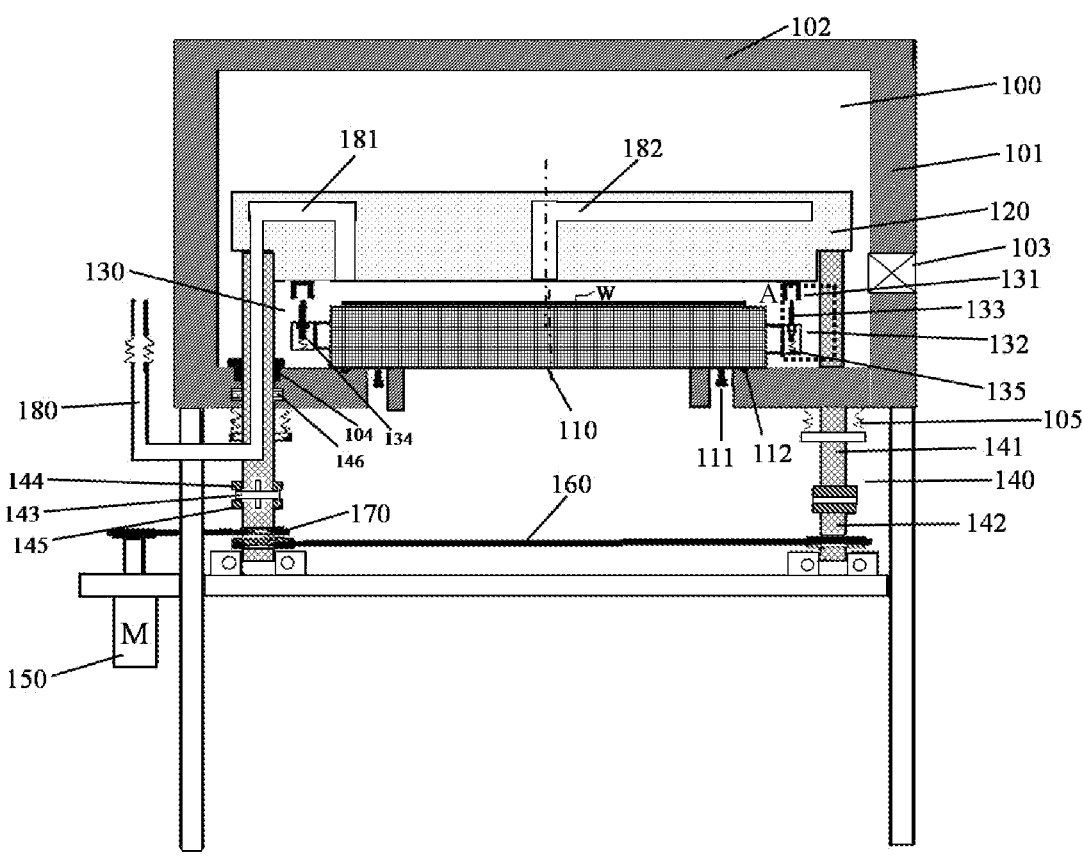
FIG. 2 is a schematic diagram of the plasma processing apparatus before center alignment according to the present disclosure.
Figure 3:
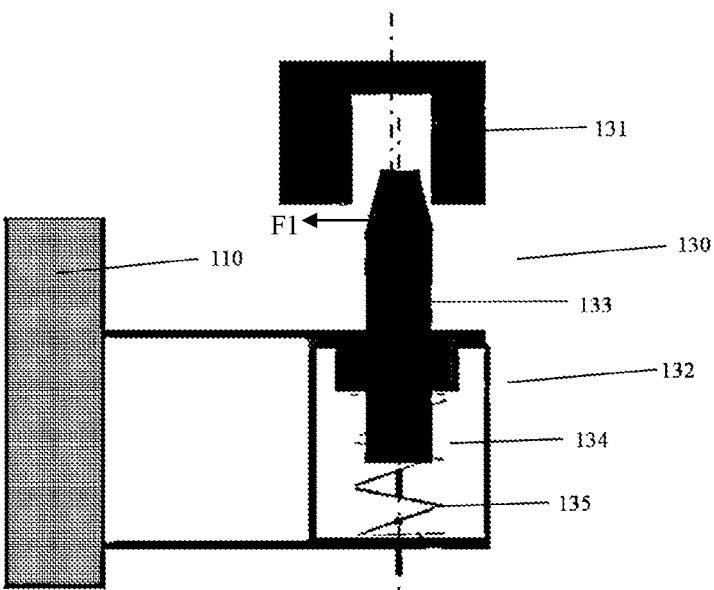
FIG. 3 is an enlarged view when Region A in FIG. 2 is under adjustment.
Figure 4:
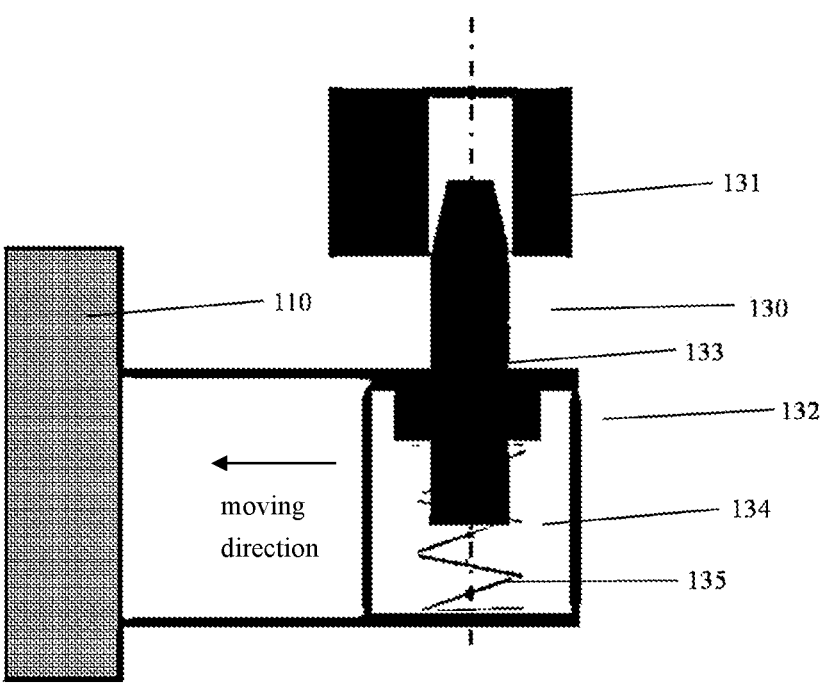
FIG. 4 is an enlarged view of Region A in FIG. 2 after adjustment.

In this embodiment, the plasma processing apparatus includes two self-alignment devices 130, wherein the two self-alignment devices 130 are symmetrically arranged around the movable upper electrode assembly 120, jointly acting to enable center alignment between the movable upper electrode assembly 120 and the bottom electrode assembly 110. As illustrated in FIG. 2, the center axis of the movable upper electrode assembly 120 does not overlap that of the bottom electrode assembly 110. When performing adjustment, the guide pin 133 is inserted into the aligning hole, the movable upper electrode assembly 120 continuously moves downward; in this case, the guide pin, under the acting forces in the radial direction F1 and the vertical direction F2 (see FIG. 3), drives the bottom electrode assembly 110 connected therewith to be displaced in the horizontal direction till realizing overlap between the movable upper electrode assembly 120 and the bottom electrode assembly 110 (see FIG. 4).

Figure 5:
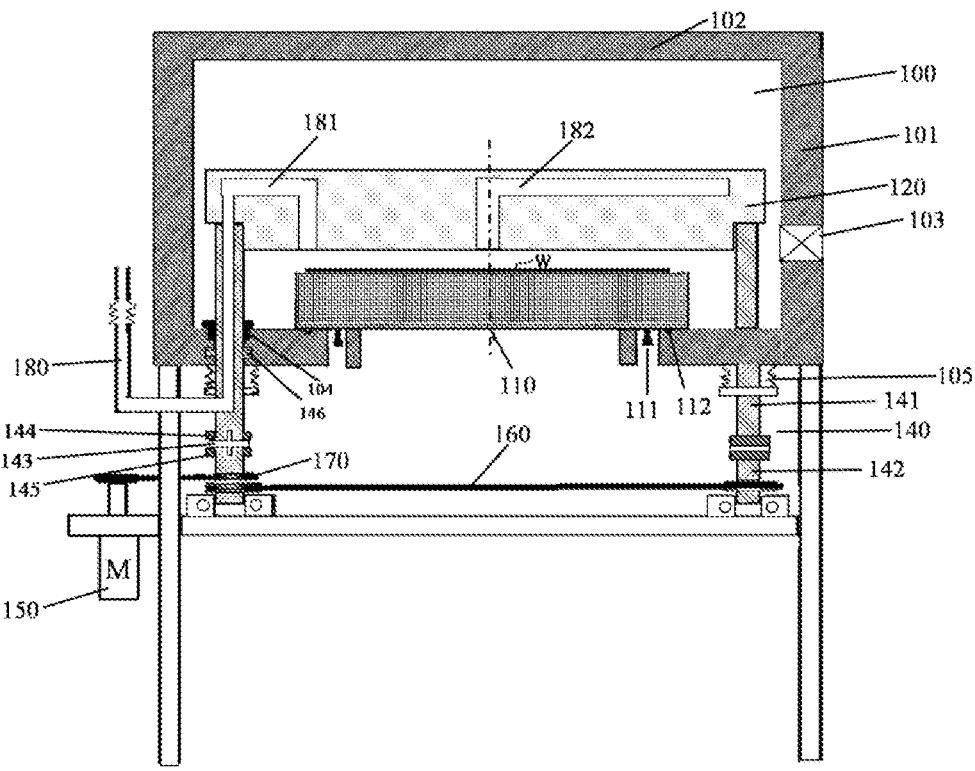
FIG. 5 is a schematic diagram of the plasma processing apparatus after center alignment according to the present disclosure.

In this embodiment, the self-alignment devices 130 are conveniently operable and easily detachable. As illustrated in FIG. 5, during the course of assembling the plasma processing apparatus, after the movable upper electrode assembly 120 and the bottom electrode assembly 110 are center aligned, the respective self-alignment devices 130 may be removed such that more components may be installed in the vacuum chamber 100 to ensure the etching performance of the etch reaction.

The plasma processing apparatus further comprises a plurality of lift devices which are connected with the movable upper electrode assembly 120, respectively, so as to lift and lower the movable upper electrode assembly 120. Each of the lift devices includes a support structure 140 and a drive device 150, one end of the support structure 140 being connected to the movable upper electrode assembly 120, the other end thereof being connected to the drive device 150, wherein the drive device 150 is configured to drive the support structure 140 to lift and lower the movable upper electrode assembly 120.

Optionally, the drive device 150 is a stepper motor or a linear motor. Of course, the types and structures of the drive device 150 are not limited to those mentioned herein. Other types or structures of drive device 150 are also applicable, as long as they can drive the support structure 140 to be lifted and lowered.

Furthermore, the support structure 140 includes a guide rod 141 and a threaded rod 142. The guide rod 141 is connected with the movable upper electrode assembly 120; one end of the threaded rod 142 is connected to the drive device 150, and the other end of the threaded rod 142 is connected to the guide rod 141. In this embodiment, the bottom of the guide rod 141 is disposed outside the vacuum chamber 100, and the top thereof is disposed in the vacuum chamber 100; the threaded rod 142 is connected to the bottom of the guide rod 141 via a horizontal adjustment assembly; the horizontal adjustment assembly may adjust the length of the support structure 140 where it is located so as to perform horizontal adjustment to the movable upper electrode assembly 120. Optionally, the guide rod 141 and the threaded rod 142 are made of the same material.

When installing the plasma processing apparatus, the chamber body fabrication process of the vacuum chamber 100 may guarantee that the bottom electrode assembly 100 is horizontal relative to the ground, but the movable upper electrode assembly 120 might tilt, such that the center of the movable upper electrode assembly 120 is bevel and does not overlap the center of the bottom electrode assembly 110. In wafer W bevel etch process, the overlap between the etching areas of the movable upper electrode assembly 120 and the bottom electrode assembly 110 is critical. A horizontal adjustment assembly is employed to adjust the length of the support structure at an upper or lower position, so as to lower or raise the plane of the movable upper electrode assembly 120 at that level, till the movable upper electrode assembly 120 maintains horizontal, further facilitating overlap between the etching areas and guaranteeing the etching effect to the wafer W. Additionally, since the horizontal adjustment assembly is positioned outside the vacuum chamber 100, the levelling process to the movable upper electrode assembly 120 during the course of using the plasma processing apparatus can be realized by controlling the horizontal adjustment assembly externally, without additional complex procedures such as opening the chamber.

Specifically, the horizontal adjustment assembly includes a cross-shaped structure 143 and a clamping mechanism. An upper end of the cross-shaped structure 143 is in threaded connection with the inner surface of the bottom of the guide rod 141, and the lower end thereof is in threaded connection with the inner surface of the top of the threaded rod 142. The clamping mechanism includes an upper clamping device 144 and a lower clamping device 145, the upper clamping device 144 being in threaded connection with the outer surface of the bottom of the guide rod 141, the lower clamping device 145 is in threaded connection with the outer surface of the top of the threaded rod 142, the upper clamping device 144 and the lower clamping device 145 vertically clamp together to fix the left and right ends of the cross-shaped structure 143.

To perform levelling processing to the movable upper electrode assembly 120, the upper clamping device 144 and the lower clamping device 145 of the clamping mechanism are first adjusted to loosen the cross-shaped structure 143. Then, the cross-shaped structure 143 at the lower or higher position of the movable upper electrode assembly 120 is rotated till the movable upper electrode assembly 120 maintains horizontal. Finally, the upper clamping device 144 and the lower clamping device 145 of the clamping mechanism are adjusted to securely clamp the left and right ends of the cross-shaped structures 143, thereby completing leveling adjustment of the movable upper electrode assembly 120. The horizontal adjustment assembly is simple in structure and convenient to use, which eliminates a need of installing a large tool to perform the leveling processing, thereby significantly saving the installation space. As far as the plasma processing apparatus is concerned, the saved installation space significantly improves the flexibility of installing and arranging the components surrounding and inside the vacuum chamber 100, without affecting placement and use of other components.

The plasma processing apparatus further comprises a first gearing device 160 which encloses and is in threaded connection with the respective support structures 140. A plurality of recessed structures is provided at portions where the bottom of the chamber body 101 is in contact with the guide rod 141 of the support structure 140; a plurality of extended elements 146 are correspondingly provided along the circumferential direction of the guide rod 141, wherein the extended elements 146 may be vertically displaced in the recesses, but nonrotatable in the circumferential direction.

Furthermore, the drive device 150 is in threaded connection with one support structure 140 of a plurality of support structures 140 via a second gearing device 170, such that when the drive device 150 rotates, the support structure 140 is driven to be vertically displaced due to reacting force of the support structure 140, while the remaining support structures 140 are driven to be displaced synchronously via the first gearing device 160. The drive device 150 realizes vertical driving of all support structures 140 by driving one support structure 140, further realizing vertical displacement of the movable upper electrode assembly 120. As such, the overall apparatus is simple in structure and convenient to use. Optionally, the first gearing device 160 is of a belt structure, and the second gearing device 170 is also of a belt structure; the length range of the second gearing device 170 is narrower than that of the first gearing device 160.

The plasma processing apparatus further comprises a plurality of guide bearings 104. The guide bearings 104 are respectively disposed at the portions where the bottom of the chamber body 101 is in contact with the support structures 140, so as to ensure lifting verticality of the support structures 140.

The plasma processing apparatus further comprises a plurality of sealing devices 105, wherein the sealing devices 105 are respectively sleeved over the portions where the support structures 140 is outside the vacuum chamber 100, wherein each of the sealing devices 105 has one end connected to the bottom of the chamber body 101, and the other end connected to the support structure 140. In this way, even repeated lifting and lowering of the support structures 140 does not affect the atmospheric environment in the vacuum chamber 100.

Furthermore, a plurality of sealing structures 112 are also provided between the bottom of the bottom electrode assembly 101 and the chamber body 101 so as to ensure air-tightness of the vacuum chamber 100. In this embodiment, the sealing structure 112 refers to an O-shaped seal ring, which is disposed between the bottom of the bottom electrode assembly 110 and the reaction chamber 101 in case that the gap therebetween would damage the atmospheric environment in the vacuum chamber 100.

Additionally, the plasma processing apparatus further comprises a plurality of gas channels 180 each extending from outside the vacuum chamber 100, through the bottom of the vacuum chamber 100, the inside of the support structure 140, and the movable upper electrode assembly 120 in sequence, respectively, wherein the gas channels 180 are configured to inject process gases into the vacuum chamber 100. In this embodiment, the movable upper electrode assembly 120 is non-connected with the chamber lid 102, such that even repeated opening and closing of the chamber lid 102 would not affect the position of the movable upper electrode assembly 120, facilitating the concentricity between the movable upper electrode assembly 120, the wafer W, and the bottom electrode assembly 110 during use of the apparatus, which not only ensures the processing performance of bevel etch, but also reduces energy and time consumed by operators, thereby facilitating performing the wafer W etch process.

Furthermore, a plasma corrosion-resistive coating is applied to the inner surface of the gas channels 180 for purposes of protection, avoiding particle shedding from contaminating the chamber environment of the vacuum chamber 100. Optionally, the plasma corrosion-resistive coating material refers to a Teflon coating, or a yttrium oxide film, or an anodized aluminum layer.

In this embodiment, the plasma processing apparatus comprises three support structures 140 and three gas channels 180, wherein the respective support structures 140 are uniformly distributed along the circumferential direction of the movable upper electrode 120. The respective gas channels 180 access the inside of the guide rod 141 of the respective support structures 140 from outside the vacuum chamber 100 so as to inject multiple species of process gases inside the vacuum chamber 100.

Furthermore, in this embodiment, the gas channels 180 in the movable upper electrode assembly are edge gas inlet channels 181 or center gas inlet channels 182. The edge gas inlet channels 181 adopt a multi-path distribution structure in the movable upper electrode assembly 120, including a plurality of edge gas nozzles at the bottom of the movable upper electrode assembly 120; the respective edge gas nozzles are uniformly distributed along the edge area of the wafer W (similar to a showerhead structure) so as to uniformly inject a first gas above the edge area of the wafer W, facilitating guaranteeing the bevel etching performance of the wafer W. The center gas inlet channel 182 includes a plurality of center gas nozzles, wherein the center gas nozzles are disposed above the center area of the wafer W so as to inject a second gas above the center area of the wafer W. Generally, in the bevel etch process, the first gas injected into the edge gas inlet channel 181 includes an etch gases such as F and Cl, a clean gas such as $O_2$, and other etch-assisted gases, so as to perform bevel etch. The second gas injected into the center gas inlet channel 182 includes a purge gas or a clean gas, wherein the purge gas is configured to maintain a high gas pressure above the wafer W when performing edge gas area processing to the wafer W, such that the center area of the wafer W is not etched by plasma environment; and the clean gas is configured to clean the vacuum chamber 100 when no wafer W is loaded in the vacuum chamber 100.

During the course of bevel etch, the first gas (e.g., Ar, $CF_4$, $O_2$, etc.) accesses above the edge area of the wafer W in the vacuum chamber 100 via the edge gas inlet channels 181, forming plasma under RF excitation. The plasma, after being subjected to the electrical field (capacitive coupled) between the movable upper electrode assembly 120 and the bottom electrode assembly 110, reacts with redundant film layers accumulated at the edge area of the wafer W, thereby removing the redundant film layers generated in the other processes. Meanwhile, the second gas accesses above the center area of the wafer W in the vacuum chamber 100 via the center gas inlet channels 182; in this way, by adjusting the flow rate or pressure of the second gas, the center area of the wafer W can be protected from being affected by the plasma environment.

Of course, the structure types and positional relationships of the gas channels 180 are not limited to what have been described above, which can be any structure that may implement process gases injection. In other embodiments, each of the gas channels 180 extends from outside the vacuum chamber 100, through the top of the vacuum chamber 100 (i.e., the chamber lid 102), and the movable upper electrode assembly 120 in sequence, respectively, wherein the gas channels 180 are configured to inject process gases into the vacuum chamber 100. The injection course of the process gases can be carried out independently without going through the inside of the support structures 140.

In another aspect, in installing and testing the plasma processing apparatus, the following method may be employed to perform center alignment between the movable upper electrode assembly 120 and the bottom electrode 110:

loosening connection between the bottom electrode assembly 110 and the chamber body 101; adjusting the movable upper electrode assembly 120 to move downward such that the self-alignment upper structures 131 and the self-alignment lower structures 132 are aligned to be joined together, wherein the bottom electrode assembly 110 is stressed to be displaced; and aligning the self-alignment upper structures 131 and the self-alignment lower structures 132 to be joined together, so as to adjust the movable upper electrode assembly 120 and the bottom electrode assembly 110 to be concentric.

The method further includes: after completing center alignment, i.e., concentricity adjustment, detaching the self-alignment upper structures 131 from the self-alignment lower structures 132, so as not to occupy the space in the vacuum chamber 100.

Additionally, in cases that the movable upper electrode assembly 120 tilts, the movable upper electrode assembly 120 may be levelled first before concentricity adjustment, wherein the levelling processing specifically comprises: adjusting the upper clamping device 144 and the lower clamping device 145 of the clamping mechanism, to loosen the cross-shaped structure 143; rotating the cross-shaped structure 143 at a lower or upper position of the movable upper electrode assembly 120 till the movable upper electrode 120 maintains horizontal; and adjusting the upper clamping device 144 and the lower clamping device 145 of the clamping mechanism, such that the upper clamping device 144 and the lower clamping device 145 securely clamp together left and right ends of the cross-shaped structure 143.

During use, vertical movement of the support structure 140 is enabled by the drive device 150, the first gearing device 160, and the second gearing device 170, specifically: activating the drive device 150 to rotate to drive, via the second gearing device 170, vertical movement of the support structure 140 in contact with the second gearing device, and to drive, via the first gearing device 160, the remaining support structures 140 to rotate synchronously.

Second Embodiment

Figure 6:
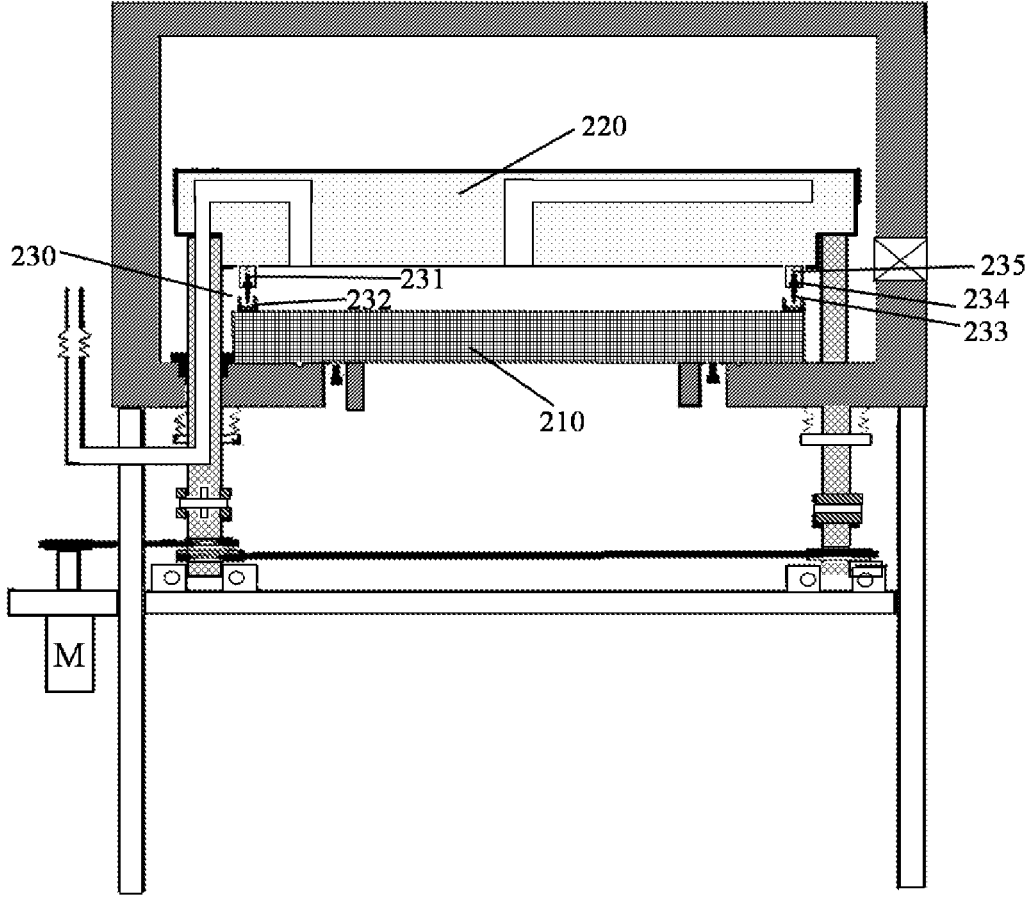
FIG. 6 is a schematic diagram of a plasma processing apparatus in another embodiment.

Please refer to FIG. 6. This embodiment makes some alternation to the structure of the self-alignment device 230 over the structural features of the plasma processing apparatus in the first embodiment, mainly altering the self-alignment upper structure 231 and the self-alignment lower structure 232.

In this embodiment, the self-alignment lower structure 232 is an aligning hole of a recessed structure, the aligning hole being connected to the lower electrode assembly 210 via a screw assembly. The self-alignment upper structure 231 is a guide mechanism connected with the movable upper electrode assembly 220 via a screw assembly. The guide mechanism includes: a guide pin 233, an elastomer 235, and an accommodation space 234 having a through hole provided at the bottom, the through hole being arranged opposite the aligning hole, wherein the elastomer 235 is disposed in the accommodation space 234 and connected with the top of the guide pin 233, the guide pin 233 is at least partially disposed in the accommodation space 234 and protrudes out of the accommodation space 234 via the through hole, such that the guide pin 233, when entering the aligning hole, pushes the bottom electrode assembly 210 and the movable upper electrode assembly 220 to be center aligned.

In this embodiment, the guide pin 233 is positioned above the aligning hole, such that it can enter the aligning hole of the self-alignment lower structure 232 more easily so as to perform center alignment between the movable upper electrode assembly 220 and the bottom electrode assembly 210. The other structural parts and operating manners of respective components in this embodiment are all identical to those in First Embodiment, which will not be described in detail here.

In view of the above, the present discloses a plasma processing apparatus and a method of adjusting the same, wherein the plasma processing apparatus enables concentricity adjustment between the movable upper electrode assembly 120 and the lower electrode assembly 110 by virtue of the self-alignment upper structures 131 and the self-alignment lower structures 132 of the self-alignment devices 130. The self-alignment devices 130 are simple in structure and convenient to operate. The self-alignment devices 130 may be detached to save the space in the vacuum chamber 100, such that other components may be flexibly placed and arranged in the vacuum chamber 100, enhancing spatial utilization.

Further, in the plasma processing apparatus, the process gases are injected into the vacuum chamber 100 via the inside of the support structures 140 and the movable upper electrode 120. As the movable upper electrode assembly 120 and the chamber lid 102 are non-connected, even frequent opening of the chamber lid 102 does not affect the concentricity between the movable upper electrode assembly 120 and the bottom electrode assembly 110, thereby avoiding frequently adjusting their concentricity.

Furthermore, the plasma processing apparatus leverages the drive device 150 to activate the second gearing device 170 to rotate to drive one support structure 140 contacting the second gearing device 170 to be displaced vertically; and meanwhile activate the first gearing device 160 to drive the remaining support structures 140 to synchronously move vertically; the plurality of components cooperate to jointly implement lifting and lowering of the movable upper electrode assembly120; therefore, the plasma processing apparatus according to the present disclosure is simple in structure and convenient to operate.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

What is claimed is:

1. A plasma processing apparatus, comprising:
   a vacuum chamber enclosed by a chamber body and a chamber lid;
   a lifting device comprising at least one drive device and a support structure, wherein the support structure includes a vertical guide rod;
   a movable upper electrode assembly disposed in the vacuum chamber and separated from the chamber lid, the movable upper electrode assembly including a plurality of gas channels including a plurality of edge gas inlet channels and a center gas inlet channel, the vertical guide rod is connected to a bottom surface of the movable upper electrode assembly, at least one gas channel of the plurality of gas channels passing through an inside of the vertical guide rod to transfer process gases;
   a bottom electrode assembly, arranged opposite the movable upper electrode assembly, the bottom electrode assembly being detachably connected with a bottom of the chamber body; and
   a plurality of self-alignment devices including a plurality of self-alignment upper structures and a plurality of self-alignment lower structures, each of the plurality of self-alignment devices including a self-alignment upper structure of the plurality of self-alignment upper structures and a self-alignment lower structure of the plurality of self-alignment lower structures, the plurality of self-alignment upper structures and the plurality of self-alignment lower structures being connected to the movable upper electrode assembly and the bottom electrode assembly, respectively, wherein the plurality of self-alignment upper structures and the plurality of self-alignment lower structures are aligned to be jointed together by aligning a center of the movable upper electrode assembly with a center of the bottom electrode assembly.

2. The plasma processing apparatus according to claim 1, wherein:
   the self-alignment upper structure is an aligning hole of a recessed structure, the aligning hole being connected to the movable upper electrode assembly; and
   the self-alignment lower structure is a guide mechanism connected to the bottom electrode assembly, the guide mechanism including a guide pin, wherein the guide pin, when entering the aligning hole, pushes the bottom electrode assembly and the movable upper electrode assembly to be center aligned.

3. The plasma processing apparatus according to claim 1, wherein:

the self-alignment lower structure is an aligning hole of a recessed structure, the aligning hole being connected to the bottom electrode assembly; and the self-alignment upper structure is a guide mechanism, which is connected to the movable upper electrode assembly, the guide mechanism including a guide pin, wherein the guide pin, when entering the aligning hole, pushes the bottom electrode assembly and the movable upper electrode assembly to be center aligned.

4. The plasma processing apparatus according to claim 2, wherein:

the guide mechanism comprises an accommodation space provided with a through hole, the through hole being arranged opposite the aligning hole, the guide pin being at least partially received in the accommodation space.

5. The plasma processing apparatus according to claim 2, wherein:

a top of the guide pin has a bevel structure.

6. The plasma processing apparatus according to claim 4, wherein each self-alignment device of the plurality of self-alignment devices further comprises:

an elastomer disposed in the accommodation space, the elastomer being connected to the bottom of the guide pin.

7. The plasma processing apparatus according to claim 1, wherein the lifting device further includes a plurality of the support structures, each of the plurality of support structures being connected to the movable upper electrode assembly so as to lift and lower the movable upper electrode assembly; the support structure of the plurality of support structures having a first end connected to the movable upper electrode assembly and a second end connected to the at least one drive device, and the at least one drive device being configured to drive the support structure to lift and lower the movable upper electrode assembly.

8. The plasma processing apparatus according to claim 7, further comprising:

the plurality of gas channels including the plurality of edge gas inlet channels and the center gas inlet channel, each of the plurality of gas channels extending from outside the vacuum chamber, through the bottom of the vacuum chamber, the inside of the vertical guide rod of the plurality of support structures, and the movable upper electrode assembly in sequence, respectively, wherein the plurality of gas channels are configured to inject the process gases into the vacuum chamber.

9. The plasma processing apparatus according to claim 8, wherein the support structure further comprises:

a threaded rod, a first end of which is connected to the at least one drive device, a second end of which is connected to the vertical guide rod.

10. The plasma processing apparatus according to claim 9, wherein the threaded rod is connected to the vertical guide rod via a horizontal adjustment assembly, the horizontal adjustment assembly including:

a cross-shaped structure, an upper end of which is in threaded connection with the bottom of the vertical guide rod, a lower end of which is in threaded connection with a top of the threaded rod; and a clamping mechanism, including an upper clamping device and a lower clamping device, the upper clamping device being in threaded connection with the bottom of the vertical guide rod, the lower clamping device being in threaded connection with the top of the threaded rod, wherein the upper clamping device and the lower clamping device vertically clamp together to secure left and right ends of the cross-shaped structure.

11. The plasma processing apparatus according to claim 7, further comprising:

a first gearing device, which encloses and is in threaded connection with each of the plurality of support structures; wherein a plurality of recessed structures is provided at a plurality of portions where the bottom of the chamber body is in contact with the plurality of support structures, a plurality of extended elements being provided along a circumferential direction of the plurality of support structures, the plurality of extended elements being vertically displaceable in the plurality of recessed structures, but nonrotatable in the circumferential direction; and a second gearing device via which the at least one drive device is in threaded connection with the support structure of the plurality of support structures, wherein when the at least one drive device rotates, the support structure is driven to be vertically displaced, while remaining support structures are driven to be displaced synchronously via the first gearing device.

12. The plasma processing apparatus according to claim 11, wherein:

the first gearing device is a belt structure;

and/or the second gearing device is a belt structure.

13. The plasma processing apparatus according to claim 7, further comprising:

a plurality of guide bearings, respectively disposed at a plurality of portions where the bottom of the chamber body is in contact with the plurality of support structures, so as to ensure lifting perpendicularity of the plurality of support structures.

14. The plasma processing apparatus according to claim 7, further comprising:

a plurality of sealing devices, respectively sleeved over portions where the plurality of support structures are outside the vacuum chamber, wherein each of the plurality of sealing devices has a first end connected to the bottom of the chamber body, and a second end connected to a respective support structure.

15. The plasma processing apparatus according to claim 8, wherein:

the plurality of gas channels include the plurality of edge gas inlet channels and the center gas inlet channel, wherein the plurality of edge gas inlet channels are configured to inject the process gases above a wafer edge area in the vacuum chamber via a plurality of edge gas nozzles, and wherein the center gas inlet channel is configured to inject the process gases above a wafer center area of the vacuum chamber via a plurality of center gas nozzles.

16. The plasma processing apparatus according to claim 1, wherein:

the bottom electrode assembly is connected with the bottom of the chamber body via a screw assembly;

and/or, a plurality of sealing structures is further provided between the bottom of the bottom electrode assembly and the chamber body so as to ensure air-tightness of the vacuum chamber;

and/or, the plurality of self-alignment devices are made of a metal material;

and/or, the self-alignment upper structure is connected with the movable upper electrode assembly or the bottom electrode assembly via a screw assembly;

and/or, the self-alignment lower structure is connected with the bottom electrode assembly or the movable upper electrode assembly via a screw assembly.

\* \* \* \* \*